United States Patent [19]

Kubozoe et al.

[11] 4,121,100
[45] Oct. 17, 1978

[54] ELECTRON MICROSCOPE

[75] Inventors: Morioki Kubozoe; Yoshihisa Minamikawa, both of Katsuta; Shinjiro Katagiri, Mito, all of Japan

[73] Assignee: Hitachi, Ltd., Japan

[21] Appl. No.: 788,538

[22] Filed: Apr. 18, 1977

[30] Foreign Application Priority Data

Apr. 21, 1976 [JP] Japan .................................. 51-44490

[51] Int. Cl.² ...................... G01M 23/00; G21M 1/08
[52] U.S. Cl. ............................. 250/311; 250/396 ML
[58] Field of Search ................................. 250/311, 396

[56] References Cited

U.S. PATENT DOCUMENTS 2,354,263   7/1944   Hillier .................................. 250/311
3,696,246  10/1972   Buchanan .............................. 250/311

Primary Examiner—Harold A. Dixon
Attorney, Agent, or Firm—Craig & Antonelli

[57] ABSTRACT

An electron beam from an electron gun is made to focus on a first position by a focussing lens system. The focussed beam is then magnified and projected on a screen through a magnification lens system having an objective lens, an intermediate lens and a projection lens.

The excitation is so variable that the electron beam may be focussed also on a second position behind the projection lens.

A specimen is positioned at the first position for normal electron microscope analysis, while, for a scanning electron microscope analysis, another specimen is put at the second position.

10 Claims, 2 Drawing Figures

4,121,100

ELECTRON MICROSCOPE

BACKGROUND OF THE INVENTION

1. Field of the Invention

The present invention relates to an electron microscope, especially of a type capable of functioning also as a scanning type electron microscope.

2. Description of Prior Arts

Recently, various attempts have been made to provide a normal electron microscope with a function of scanning type electron microscope.

In one example of such attempts, a specimen is disposed within a magnetic field of an objective lens capable of producing an intense magnetic field.

An electron beam is focussed on the specimen by the magnetic field distributed over an area at the incident side of the specimen, which magnetic field is produced by the objective lens and referred to as "fore magnetic field". At the incident side of the fore magnetic field, i.e. at one side of that field closer to an electron gun, there is provided a deflector for deflecting the focussed electron beam so that the specimen is scanned with the focussed electron beam two-dimensionally. Although this type of microscope has a high resolution, due to the short focal length of the lens formed by the fore magnetic field, the magnetic field is inconveniently disturbed resulting in an astigmatism, when the specimen is ferromagnetic, to deteriorate the resolution unfavourably.

In addition, the depth of focus is small, due to an extremely large convergent angle of the incident electron beam, so that a field of three dimensions as can be obtained in the usual scanning microscope's secondary electron image is not obtainable.

Another disadvantage is that the size of the specimen is inevitably limited by the size of the magnetic pole of the objective lens.

In another attempt for imparting the scanning function to the electron microscope, the specimen is positioned not in the magnetic field of the objective lens but at the emitting side of the objective lens, as is the case of usual electron microscope specifically designed for scanning.

In this case, the electron beam is focussed on the specimen by a relatively less intense excitation of the objective lens, while the specimen is scanned with the focussed electron beam which is deflected by a deflector disposed at incident side of the specimen.

Although this type of microscope can overcome above described shortcomings inherent in the first mentioned example, the resolution of the scanning electron microscope is largely decreased, due to an increased coefficient of spherical abberation. This is due to the fact that the distance between the objective lens and the specimen is large, partly because the upper and the lower magnetic poles for forming objective magnetic field are made to project closer to the axis of the beam than other portion of the objective lens, and partly because the projecting portions are not located at the emitting end of the objective lens.

Under these circumstances, the present inventors have noted that the distance between the objective lens and the specimen can be decreased by positioning the magnetic field of the objective lens at the emitting end of the objective lens, through forming the lower magnetic pole of the objective lens in a flat plate-like shape.

However, in usual electron microscope, in order to preserve its performance, the objective lens must have the value of $IN/\sqrt{E}$ ($IN$ denotes ampere turn, and $E$ means acceleration voltage) as large as 15 to 16.

Thus, the study by the present inventors has been focussed on whether the above value is met or satisfied, when the objective magnetic field is positioned at the emitting end of the objective lens by making the lower pole in the flat plate-like form.

As a result, it has been concluded that the $IN/\sqrt{E}$ value as large as 15 to 16 is not obtainable, due to a magnetic saturation of the objective lens.

SUMMARY OF THE INVENTION

It is therefore an object of the invention to provide an electron microscope having an additional function of scanning type electron microscope.

It is another object of the invention to provide an electron microscope capable of functioning as a scanning electron microscope in which the specimen to be analyzed is positioned materially out of the magnetic field of the lens.

It is still another object of the invention to provide an electron microscope having an additional function of scanning microscope in which the performances of the usual electron microscope and the specifically designed usual scanning electron microscope are compatively preserved.

According to the invention, an electron beam is focussed on a predetermined first position by a focussing lens system, and is then magnified and projected on a screen through a magnification lens system including an objective lens and at least one additional magnification lens. Consequently, an electron microscopic image of a specimen, which is positioned at the first position, is formed on the screen for analysis.

According to the invention, there are further provided means for holding a specimen to be scanned at a second position disposed outside the additional lens and at the side thereof closer to the screen, means for actuating the focussing lens system and the magnification lens system to focus the electron beam on the second position, means for scanning the specimen at the second position by the electron beam focussed on that position and means for detecting a signal inherent in the specimen resulted by the scanning.

The at least one magnification lens other than the objective lens may be a projection lens, in a microscope having a magnification lens system consisting of an objective and a projection lenses, whereas it may be an intermediate lens, if the magnification system further includes an intermediate lens.

These and other objects, as well as advantageous features of the invention will become clear from the following description of preferred embodiments taken in conjunction with the attached drawings in which:

DESCRIPTION OF THE PREFERRED EMBODIMENTS

Figure 1:
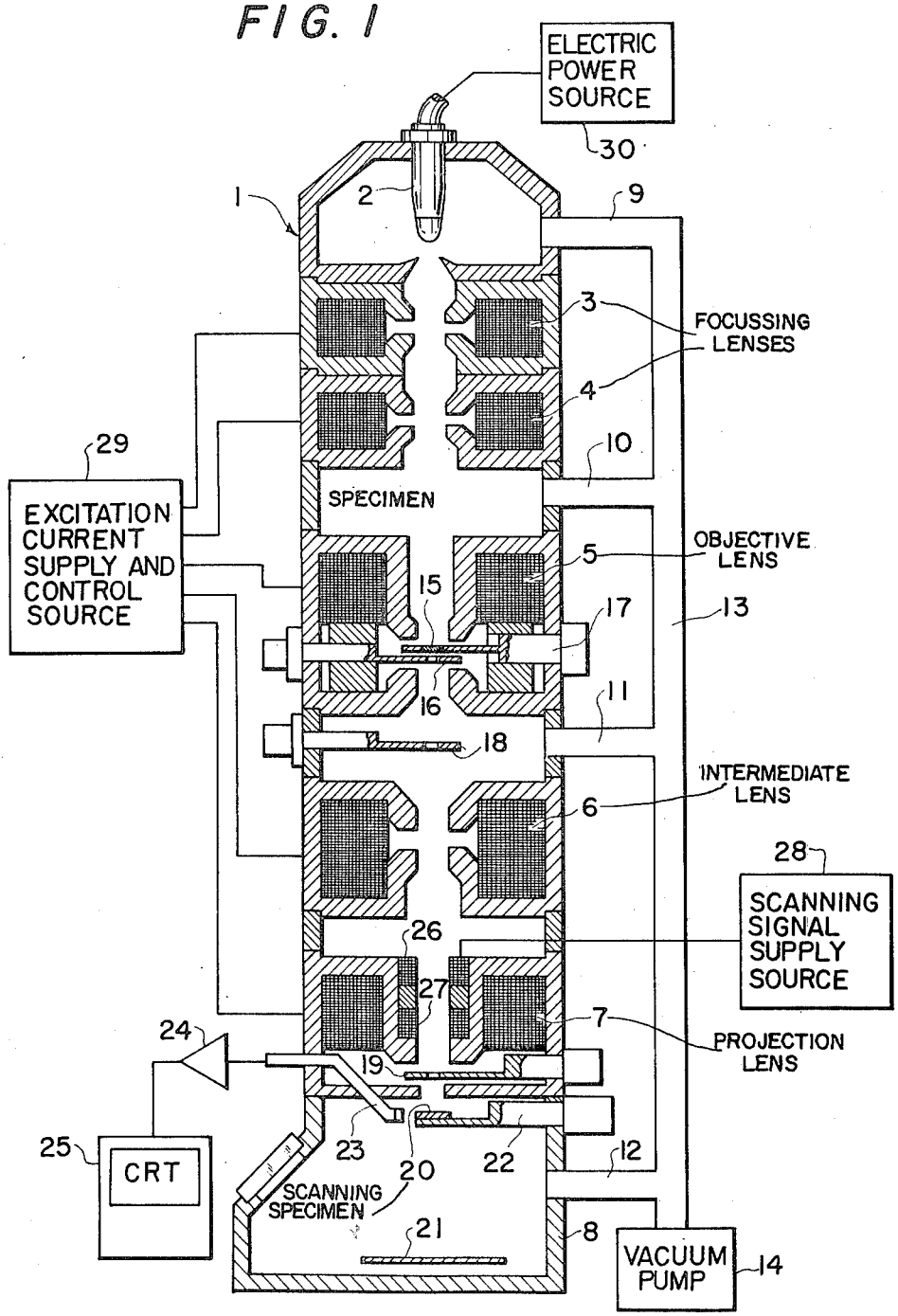
FIG. 1 is a vertical sectional view of an electron microscope constituting a preferred embodiment of the present invention.

Referring at first to FIG. 1, a microscope column 1 of an electron microscope embodying the invention generally includes an electron gun section 2, a focussing lens system having a first and a second focussing lens 3, 4, a magnification lens system having an objective lens 5, a intermediate lens 6 and a projection lens 7, and an image-observation section 8.

Each lens is of a magnetic field type and, therefore, include an upper and a lower magnetic poles and an excitation coil for forming a magnetic lens field therebetween, in a manner known per se.

The wall of the column 1 is connected to a vacuum pump 14, through evacuation pipes 9 to 13, for evacuating the interior of the column 1.

An electron beam diaphragm 16 and a specimen to be electron-microscopically analyzed 15 are disposed between the upper and lower magnetic poles of the objective lens 5, i.e. within the magnetic lens field. The specimen 15 is suitably held by a holder 17. The specimen holder 17 and the electron beam diaphragm 16 are secured to the wall of the column 1 detachably independently.

Electron beam diaphragms 18 and 19 are disposed between the objective and the intermediate lenses 5, 6 and between the upper and lower poles of the projection lens 7, respectively, and are secured to the wall of the column 1 also detachably.

In the observation section 8, are disposed a specimen 20 to be scanned and a screen 21 for the observation. The screen 21 is positioned at the bottom portion of the observation section 8.

The magnetic lens field formed between the poles of the projection lens 7 is located at the end of the latter closer to the observation section 8.

The lower pole of the projection lens 7 is formed to have a shape of a flat plate.

The specimen 20 to be scanned is positioned outside but as close as possible to the lens field of the projection lens 7, being held by a specimen holder 22 detachably secured to the wall of the column 1 just below the flat plate lower pole of lens 7.

A detector 23 is disposed in the vicinity of the specimen 20, and is secured also to the wall of the 1. The detector may be adapted to convert secondary electrons emitted from the specimen 20 into a light signal and then to detect the light by a photomultiplier, or may be of other types.

A cathode ray tube 25 is connected to the detector 23 through an amplifier 24.

X and Y axes deflector coils 26 and 27 are disposed at the central recess of the projection lens 7, and are connected to a scanning signal supply source 28.

An electric power source 30 is connected to the gun section 2, while excitation current supply and control source 29 is connected to the excitation coils of respective lenses.

As the vacuum pump 14 is started, the inner cavity of the column 1 is evacuated through the evacuation pipes 9 to 13 and, after a certain time has elapsed, a predetermined vacuum is established within the column 1.

As the power source 30 for the gun section 2 and the source 29 for the lenses are actuated, an electron beam is produced by the gun section 2 and is focussed onto the specimen 15 to be microscopically analyzed by the focussing lens system having the first and the second focussing lenses 3, 4, and is transmitted therethrough.

The transmitted beam is then magnified through the objective lens 5, the intermediate lens 6 and the projection lens 7, and projected on the screen 21.

Needless to say, in this state, the electron beam diaphragms 18, 19 and the specimen 20 to be scanned are removed from the path of the electron beam.

Consequently, an electron image of the specimen 15 is formed on the screen 21.

The diaphragm 16 plays the role of an objective diaphragm for imparting a contrast to the image on the screen 21, while the diaphragm 18 acts, when disposed at the illustrated position, as an intermediate lens diaphragm for limited field electron diffraction which is known per se.

In general, the projection lens 7 has to have a value of $IN/\sqrt{E}$ of 10 to 13, in order to preserve the performance inherently provided in the electron microscope, which is smaller than that of the objective lens 5.

The present inventors have found that the $IN/\sqrt{E}$ value of 10 to 13 can be maintained, without magnetic saturation, thus avoiding the deterioration in the performance inherent in the microscope, when the lens field of the projection lens 7 is disposed at the emitting end of the later, with its lower pole being formed in a shape of a flattened plate.

When the electron microscope above described is used as a scanning electron microscope, the electron beam diaphragms 16 and 18 are withdrawn from the illustrated positions, as well as the specimen 15, while, instead, the electron beam diaphragm 19 and the specimen 20 are brought into the illustrated positions. In this condition, for the scanning purpose, the excitation current supply and control source 29 is so adjusted to enable the focussing lens system and the magnification lens system to act as focussing lens systems. Therefore, the electron beam comes to focus on the specimen 20 to be scanned. Needless to say, one or both of the second focussing lens 4 and the objective lens 5 may be made inactive.

Meanwhile, a two-dimensional scanning signal is imparted to the X and Y deflecting coils 26, 27 by the scanning signal supply source 28, so that the specimen 20 is scanned with the focussed electron beam two-dimensionally.

Consequently, X ray, secondary electrons, absorption electrons, cathode-luminescence and the like are produced from the specimen 20, bearing informations characterizing the specimen 20.

Among these information carriers, the secondary electrons, for example are detected by the detector 23 and changed into electric signals, which are then transmitted to the grid of a cathode ray tube 25, through the amplifier 24, to perform an intensity modulation.

Since the screen (not shown) of the tube 25 is scanned synchronously with the scanning on the specimen 20, a scanned image due to the secondary electrons from the specimen 20 is formed on the screen.

Since the $IN/\sqrt{E}$ value for the final stage of scanning electron microscope is generally 5 to 6, the $IN/\sqrt{E}$ value of the projection lens 7 is adjusted to be 5 to 6, when the lens 7 is used as a focussing lens during the use of the microscope of FIG. 1 as scanning electron microscope. This ensures the microscope of FIG. 1 to preserve the performance of a scanning electron microscope designed specifically for the scanning purpose.

The specimen 20 to be scanned is positioned, of course, out of, but as close as possible to, the lens field of the projection lens 7, so that the problem as aformentioned attributable to the positioning of the specimen in the lens field can conveniently be avoided.

In the embodiment of FIG. 1, the electron beam diaphragm 19 disposed between the upper and the lower poles of the projection lens 7 is intended to prevent the scattering of the electrons, as well as to limit the angle of spread of electron beam focussed on the specimen 20, thereby to reduce the spherical abberation.

Figure 2:
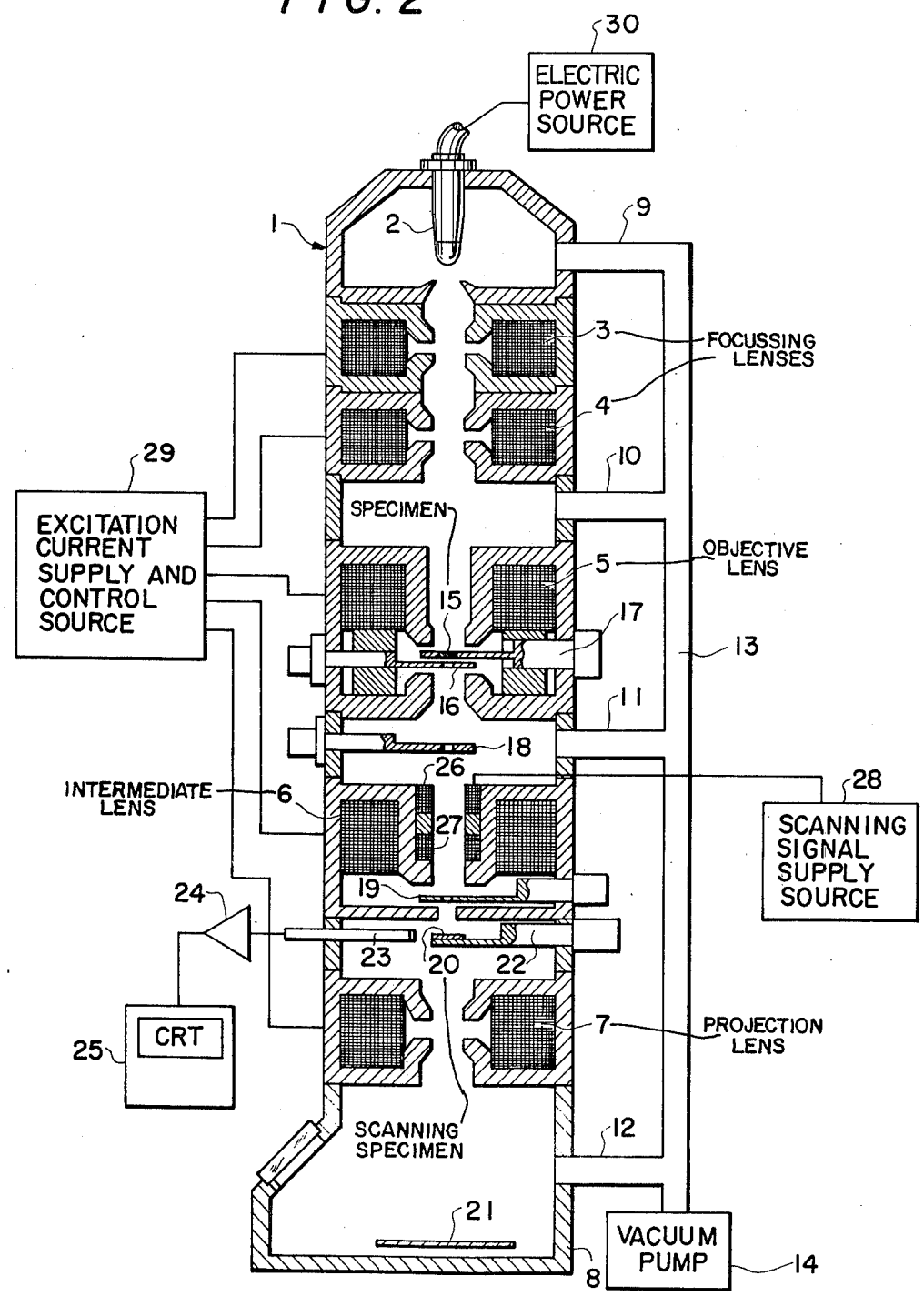
FIG. 2 is a similar view of another embodiment of the invention.

Referring now to FIG. 2 showing another embodiment of the invention, the specific features of this second embodiment corresponding to those of the first embodiment reside in that the field of the intermediate lens 6 is formed at the emitting end thereof, with the lower pole of the later being in the form of a flattened plate and in, that the electron beam diaphragm 19 is disposed between the upper and lower poles of the intermediate lens, while the specimen to be scanned is positioned outside, but as close as possible to, the field of the intermediate lens 6, and that X and Y axes deflector coils 26, 27 are disposed in the central recess of the intermediate lens 6.

Thus, it is intended to provide a scanning electron microscopic analysis at the position of the intermediate lens 6.

Since in the usual specific electron microscpoe the $IN/\sqrt{E}$ value for an intermediate lens is 10 to 13, the construction of the intermediate lens 6 as illustrated in FIG. 2 does not cause a material problem of magnetic saturation.

The electron microscope of FIG. 2 can be used as an usual, i.e. non-scanning, microscope in the similar manner to that of the first embodiment.

For the scanning purpose, the specimen 15, as well as the electron beam diaphragms 16 and 18, is removed from the illustrated positions, and the specimen 20, as well as the electron beam diaphragm 19, is put at the illustrated positions.

The projection lens 7 is de-energized, while the excitation current supply and control source 29 is made to enable all other lenses to act as focussing lenses.

The scanning signal supply source 28 is actuated to energize the deflector coils 26, 27 for X and Y axes deflections.

The second focussing lens 5 may be de-energized.

It will be clear to those skilled in the art that the microscope of FIG. 2 arranged as above can act as a scanning electron microscope, performing a similar effect to that of the microscope of FIG. 1.

Although the focussing lens system is constituted by two lenses, i.e. the first and the second focussing lenses 3, 4 in either embodiment, the focussing system may be composed of only one lens.

Similarly, the magnification lens system described to have three stages of magnification lenses may have other numbers of lenses, e.g. 2 or 4.

In either embodiment, the lower magnetic pole closest to the specimen to be scanned has a flattened plate-like form so that the distance between the later and the specimen is made small, to decrease the spherical aberration.

It is to be noted here that the words "flat plate-like" are used to mean in this specification to cover such a modification of the lower pole as having a slightly concaved surface at either one side, i.e. incident or emitting side, or having a slight step in the direction of the electron beam, between the peripheral portion of the pole and the central portion close to the specimen, since materially equivalent effect is derived also from such modifications with that of the foregoing embodiments.

In the embodiment of FIGS. 1 and 2 the lower magnetic pole of one of the projection and the intermediate lenses is made to have the flattened plate-like form. However, if necessitated, more than two lenses excepting the objective lens may have their lower pole flattened.

Although the preferred embodiments have been described with specific reference to the drawings, it is clear that various changes and modifications may be imparted thereto, without substantially departing from the scope of the invention which is limited solely by the appended claims.

What is claimed is:

1. An electron microscope having means for generating an electron beam, a focussing lens system for focussing said electron beam on a predetermined first position, a magnification lens system including an objective lens and at least two additional magnification lenses and adapted for magnifying the focussed electron beam and projecting it on a screen, and means for holding a specimen to be electron-microscopically analyzed detachably at said first position, characterized by comprising:

means for detachably holding a specimen to be scanning-electron-microscopically analyzed at a second position disposed outside the lens field of one of said additional magnification lenses and at the side thereof close to said screen; means for operating said focussing and said magnification lens systems such that they may focus said generated electron beam on said specimen to be scanning-electron-microscopically analyzed; means for scanning said specimen to be scanning-electron-microscopically analyzed with said electron beam focussed thereon to thereby generate a signal inherent in said scanned specimen; and means for detecting said signal, wherein one of said magnification lenses nearest to said second position at the side of said objective lens has an upper and a lower magnetic poles and an excitation coil for forming said lens field between said magnitic poles, said lower magnetic pole being made to have substantially flattened plate-like form.

2. An electron microscope as claimed in claim 1, wherein an electron beam diaphragm is provided between said magnetic poles detachably.

3. An electron microscope having means for generating an electron beam, a focussing lens system for focussing said electron beam on a predetermined first position, a magnification lens system including an objective lens and at least two additional magnification lenses and adapted for magnifying the focussed electron beam and projecting it on a screen, and means for holding a specimen to be electron-microscopically analyzed detachably at said first position, characterized by comprising:

means for detachably holding a specimen to be scanning-electron-microscopically analyzed at a second position disposed outside the lens field of one of said additional magnification lenses and at the side thereof close to said screen; means for operating said focussing and said magnification lens system such that they may focus said generated electron beam on said specimen to be scanning-electron-microscopically analyzed; means for scanning said specimen to be scann-electron-microscopically analyzed with said electron beam focussed thereon to thereby generate a signal inherent in said scanned specimen; and means for detecting said signal, wherein said magnification lens system includes, in addition to said objective lens, an intermediate lens and a projecting lens, each of said objective, intermediate and projecting lenses having an upper and a lower magnetic poles and an excitation coil, said lower magnetic pole of said projecting lens being made to have a substantially flattened plate-like form, said second position being disposed between said projecting lens and said screen.

4. An electron microscope as claimed in claim 3, characterized by comprising an electron beam diaphragm between said upper and lower magnetic poles of said projecting lens.

5. An electron microscope as claimed in claim 4, wherein said signal is formed of secondary electrons.

6. An electron microscope as claimed in claim 5, wherein said focussing lens system includes a first and a second focussing lenses, each of which comprises an upper and a lower magnetic poles and an excitation coil.

7. An electron microscope having means for generating an electron beam, a focussing lens system for focussing said electron beam on a predetermined first position, a magnification lens system including an objective lens and at least two additional magnification lenses and adapted for magnifying the focussed electron beam and projecting it on a screen, and means for holding a specimen to be electron-microscopically analyzed detachably at said first position, characterized by comprising:

means for detachably holding a specimen to be scanning-electron-microscopically analyzed at a second position disposed outside the lens field of one of said additional magnification lenses and at the side thereof close to said screen; means for operating said focussing and said magnification lens system such that they may focus said generated electron beam on said specimen to be scanning-electron-microscopically analyzed; means for scanning said specimen to be scanning-electron-microscopically analyzed with said electron beam focussed thereon to thereby generate a signal inherent in said scanned specimen; and means for detecting said signal, wherein said magnification lens system includes, in addition to said objective lens, an intermediate lens and a projecting lens, each of said objective lens, intermediate lens and said projecting lens having an upper and a lower magnetic poles and an excitation coil, the lower magnetic pole of said intermediate lens being made to have a substantially flattened plate-like form, said second position being positioned between said intermediate lens and said projection lens.

8. An electron microscope as claimed in claim 7, characterized by comprising an electron beam diaphragm between said upper and lower magnetic poles of said intermediate lens.

9. An electron microscope as claimed in claim 8, wherein said signal is formed of secondary electrons.

10. An electron microscope as claimed in claim 9, wherein said focussing lens system includes a first and a second focussing lenses, each of which comprises an upper and a lower magnetic fields and an excitation coil.

* * * * *